(12) United States Patent
Seo et al.

(10) Patent No.: US 12,308,142 B2
(45) Date of Patent: May 20, 2025

(54) CARBON NANOMATERIAL-BASED STRUCTURE USING ELECTRON BEAM, FLEXIBLE TRANSPARENT ELECTRODE COMPRISING THE SAME, AND METHOD FOR PRODUCING THE SAME

(71) Applicant: KOREA INSTITUTE OF SCIENCE AND TECHNOLOGY, Seoul (KR)

(72) Inventors: Young Min Seo, Wanju-gun (KR); Sukang Bae, Wanju gun (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 176 days.

(21) Appl. No.: 18/059,345

(22) Filed: Nov. 28, 2022

(65) Prior Publication Data
US 2023/0215597 A1 Jul. 6, 2023

(51) Int. Cl.
*H01B 5/14* (2006.01)
*B32B 9/00* (2006.01)
(Continued)

(52) U.S. Cl.
CPC ............. *H01B 5/14* (2013.01); *B32B 9/007* (2013.01); *B32B 27/06* (2013.01); *B32B 27/16* (2013.01); *B32B 27/281* (2013.01); *C01B 32/186* (2017.08); *C01B 32/194* (2017.08); *C08J 3/28* (2013.01); *H01B 1/04* (2013.01); *H01B 1/24* (2013.01); *B32B 2250/02* (2013.01); *B32B 2264/108* (2013.01); *B32B 2264/301* (2020.08); *B32B 2307/202* (2013.01);
(Continued)

(58) Field of Classification Search
CPC ... H01B 5/14; H01B 1/04; H01B 1/24; H01B 13/0016; H01B 13/0036; C01B 32/186; C01B 32/194; C01B 2204/22; C08J 3/28; C08J 2323/08; C08J 9/06; C01P 2006/60; C23C 16/0254; C23C 16/26; C23C 16/56; B32B 9/007; B32B 27/06; B32B 27/16; B32B 27/281; B32B 2250/02; B32B 2264/108; B32B 2264/301; B32B 2307/202; B32B 2307/412; B32B 2313/04; B32B 2457/00
See application file for complete search history.

(56) References Cited

U.S. PATENT DOCUMENTS

2019/0270643 A1* 9/2019 Corbel ................ C01B 32/194
2020/0373512 A1 11/2020 Liang
2021/0210643 A1 7/2021 Shimatani et al.

FOREIGN PATENT DOCUMENTS

CN 105514208 A * 4/2016 ........... H01L 31/075
JP 6642769 B1 2/2020
(Continued)

OTHER PUBLICATIONS

Talukder, Niladri, et al. "Nitrogen-doped graphene nanomaterials for electrochemical catalysis/reactions: A review on chemical structures and stability." Carbon 185 (2021): 198-214. (Year: 2021).*
(Continued)

*Primary Examiner* — John D Freeman

(57) ABSTRACT

Disclosed is a carbon nanomaterial-based structure, including: a polymer resin layer; and a carbon nanomaterial layer stacked on the polymer substrate, wherein the carbon nanomaterial is a carbon nanomaterial doped by electron beams.

10 Claims, 17 Drawing Sheets

(51) Int. Cl.
  *B32B 27/06* (2006.01)
  *B32B 27/16* (2006.01)
  *B32B 27/28* (2006.01)
  *C01B 32/186* (2017.01)
  *C01B 32/194* (2017.01)
  *C08J 3/28* (2006.01)
  *H01B 1/04* (2006.01)
  *H01B 1/24* (2006.01)

(52) U.S. Cl.
  CPC ..... *B32B 2307/412* (2013.01); *B32B 2313/04* (2013.01); *B32B 2457/00* (2013.01); *C01B 2204/22* (2013.01)

(56) References Cited

FOREIGN PATENT DOCUMENTS

| KR | 10-1166528 | B1 | 7/2012 |
|---|---|---|---|
| KR | 10-2012-0120690 | A | 11/2012 |
| KR | 10-2013-0112228 | A | 10/2013 |
| KR | 10-2015-0106038 | A | 9/2015 |
| KR | 10-2015-0120911 | A | 10/2015 |
| KR | 10-2017-0027756 | A | 3/2017 |
| KR | 10-2017-0044529 | A | 4/2017 |
| KR | 10-2021-0107945 | A | 9/2021 |

OTHER PUBLICATIONS

Lorenzo D'arsie et al., "Stable, efficient p-type doping of graphene by nitric acid," RSC Advances, 2016, vol. 6, pp. 113185-113192.

Jens Meyer et al., "Metal Oxide Induced Charge Transfer Doping and Band Alignment of Graphene Electrodes for Efficient Organic Light Emitting Diodes," Scientific Reports, 2014, vol. 4, No. 5380, pp. 1-7.

Sung Joo Kwon et al., "Extremely stable graphene electrodes doped with macromolecular acid," Nature Communications, 2018, vol. 9, No. 2037, pp. 1-9.

* cited by examiner

FIG. 5

| Peaks | Bonds | $E_{bind}$(eV) | Proportion (%) | | |
|---|---|---|---|---|---|
| | | | 0kGy | 800kGy | 1600kGy |
| C1s | C=C | 284.3 | 42.59 | 35.85 | x |
| | C-C | 285.1 | 37.59 | 47.98 | 68.66 |
| | C-OH, C-O-C | 286.3 | 6.93 | 7.81 | 14.98 |
| | O-C=O | 287.4 | x | 1.09 | 7.83 |
| | C=O | 288.3 | 9.38 | 5.46 | x |
| | COOH/COOR | 289.3 | x | x | 7.78 |
| | $CF_3$ | 292.5 | 3.51 | 1.81 | 0.75 |

CARBON NANOMATERIAL-BASED STRUCTURE USING ELECTRON BEAM, FLEXIBLE TRANSPARENT ELECTRODE COMPRISING THE SAME, AND METHOD FOR PRODUCING THE SAME

CROSS-REFERENCE TO RELATED APPLICATION

This application claims the priority of Korean Patent Application No. 10-2022-0002315 filed on Jan. 6, 2022, the contents of which in their entirety are herein incorporated by reference.

DESCRIPTION ABOUT NATIONAL SUPPORT RESEARCH AND DEVELOPMENT

This study was supported by following national research project:
Ministry of Trade, Industry and Energy, Republic of Korea (Development of adhesive material that can change shape more than 50% for stretch devices with a radius of curvature of 1 mm or less, Project No. 1415173051) under the superintendence of IMC co., Ltd.

BACKGROUND

1. Field

The present disclosure relates to a carbon nanomaterial-based structure using electron beam irradiation, a flexible transparent electrode including the same, and a method for producing the same.

2. Description of the Related Art

Continuous flow of electrons generated from an electron beam accelerator is referred to as electron beams, and the electron beam accelerated to a speed close to the speed of light is used in various industrial fields. The electron beam is reflected off a material, collides with electrons in a material and is emitted, while transferring kinetic energy, or transmits a material, depending on the energy. Various analysis instruments using such electrons to observe the surface of a material have been developed. High-energy electron beams transmitting a material can decompose and destroy microorganisms fixed on a product selectively, and thus have been used frequently for a group of products requiring sterilization.

Meanwhile, graphene formed with a single atomic layer of hexagonal carbon structure shows a tensile strength 311 times higher than the tensile strength of steel, an electron mobility 1,000 times higher than the electron mobility of silicon and a heat conductivity at least 10 times higher than the heat conductivity of copper, is transparent enough to transmit 97.7% of light, retains its characteristics even under bending or elongation, and has significantly high chemical stability. By virtue of such characteristics, graphene can be used widely for nanomaterials, ink, barrier materials, heat radiation materials, ultralight materials, energy electrode materials, next-generation semiconductors, display materials, or the like.

Graphene may be obtained through various methods. However, graphene obtained through chemical vapor deposition (CVD) shows the highest quality and is the most suitable for large-scale and large-area production, and thus CVD is known to be the most suitable method for commercialization of graphene.

Among the carbon nanomaterials, graphene may be used as a flexible transparent electrode material by using its transparency and flexibility, but it has a low intrinsic carrier density (graphene: $10^{11\text{-}12}$ $cm^{-2}$, metal: $10^{20}$ $cm^{-2}$ or more) and thus shows high resistance in use as an electrode. Among various methods for increasing the carrier density of graphene, doping is known as the most efficient and useful method capable of reducing sheet resistance (100 ohm/sq or less), while maintaining high transmission (90% or more) of graphene. In general, doping is carried out through deposition, coating, evaporation, or the like, of a metal, oxide, organic substance, or the like, on the surface of graphene. Such conventional doping methods require a long processing time and are complicate due to additional processing steps, and cause a limitation in doping area depending on the condition of a processing system, resulting in degradation of processability.

SUMMARY

Therefore, the present disclosure is directed to providing a carbon nanomaterial-based structure using electron beam irradiation, and a method for producing the same. Particularly, the present disclosure is directed to providing a method for improving the conductivity of a carbon nanomaterial by irradiating electron beams to a carbon nanomaterial/polymer structure.

In one aspect of the present disclosure, there is provided a carbon nanomaterial-based structure, including: a polymer resin layer; and a carbon nanomaterial layer stacked on the polymer substrate, wherein the carbon nanomaterial is a carbon nanomaterial doped by electron beams.

According to an embodiment of the present disclosure, the polymer resin may have at least one chemical structure selected from the group consisting of methyl, ethyl, phenyl, allyl, benzyl, alkene, alkyne, arene, phenol, benzoyl, alkyl halide, alcohol, ether, aldehyde, ketone, carboxylic acid, ester, amide, amine, imine, thiol, sulfide, nitrile, peroxide, or the like.

According to an embodiment of the present disclosure, the polymer resin may be derived from at least one selected from the group consisting of polyimide (PI), colorless polyimide (cPI), polymethyl methacrylate (PMMA), polyethylene terephthalate (PET), polyethylene naphthalate (PEN), polydimethyl siloxane (PDMS), polyether sulfone (PES), polyetheretherketone (PEEK), polyvinyl chloride (PVC) and polycarbonate (PC).

According to an embodiment of the present disclosure, the carbon nanomaterial may include at least one selected from the group consisting of carbon fibers, graphene, carbon nanotubes, graphite, carbon quantum dots, graphene nanoplates (GNPs), graphene oxide, amorphous carbon and carbon black.

According to an embodiment of the present disclosure, the doped carbon nanomaterial may have P-type or N-type structure/characteristics by the electron-donating or -withdrawing from the polymer resin or substrate layer through a charge transfer mechanism.

According to an embodiment of the present disclosure, the carbon nanomaterial-based structure may have a sheet resistance ranging from 10 ohm/sq to 500 ohm/sq.

According to an embodiment of the present disclosure, the carbon nanomaterial-based structure may have a sheet resistance uniformity with a sheet resistance non-uniformity of 20% or less.

According to an embodiment of the present disclosure, the carbon nanomaterial-based structure may have a transmission of 80% or more.

According to an embodiment of the present disclosure, the carbon nanomaterial-based structure may have a water permeability of $5 \times 10^{-1}$ g/m$^2$-day or less.

In another aspect of the present disclosure, there is provided a flexible transparent electrode including the above-defined carbon nanomaterial-based structure.

In still another aspect of the present disclosure, there is provided a method for producing a carbon nanomaterial-based structure, including the steps of: stacking a carbon nanomaterial layer on a polymer substrate layer; and irradiating electron beams to the carbon nanomaterial layer.

According to an embodiment of the present disclosure, the polymer resin may undergo a change in chemical structure in the step of irradiating electron beams, and the radicals, ions or electrons derived from the change in chemical structure are doped to the carbon nanomaterial to increase the carrier concentration.

According to an embodiment of the present disclosure, the step of irradiating electron beams may be carried out under gaseous atmosphere including at least one of argon, nitrogen and helium.

According to an embodiment of the present disclosure, dot-like or linear electron beams may be irradiated in the step of irradiating electron beams.

According to an embodiment of the present disclosure, the electron beams may be irradiated with an absorption dose of 3000 kGy or less in the step of irradiating electron beams.

According to an embodiment of the present disclosure, the electron beams may be irradiated with an absorption dose of 200-1600 kGy in the step of irradiating electron beams.

According to an embodiment of the present disclosure, the carbon nanomaterial-based structure may show a decrease in visible light transmission of 10% or less before and after irradiating the electron beams.

According to an embodiment of the present disclosure, the carbon nanomaterial-based structure may show a decrease in sheet resistance of 50% or more before and after irradiating the electron beams.

The carbon nanomaterial-based structure according to an embodiment of the present disclosure and the method for producing the same are advantageous in that the method includes a significantly simple process and can be performed quickly, as compared to the conventional doping methods for increasing the carrier concentration of a carbon nanomaterial, and allows uniform doping of a large-area carbon nanomaterial, not a local-area carbon nanomaterial.

In addition, a large-area carbon nanomaterial/polymer structure can be doped within several seconds (3 m/min) through an electron beam irradiation process, and the carbon nanomaterial/polymer structure is formed through a roll-to-roll process and electron beams are irradiated thereto through a continuous process, thereby providing high commercial applicability.

Further, the method according to an embodiment of the present disclosure is a newly developed technological process, can increase the carrier density of a carbon nanomaterial transferred to a polymer substrate merely through a step of irradiating electron beams to reduce resistance.

Therefore, as compared to the conventional chemical doping methods, the method according to an embodiment of the present disclosure is advantageous in that it shows high processability and time efficiency and provides excellent doping uniformity, stability and productivity.

BRIEF DESCRIPTION OF THE DRAWINGS

FIG. 5 is a table illustrating the ratio of chemical bonding to C1s of graphene/cPI before and after irradiating electron beams, as analyzed by X-ray photoelectron spectroscopy (XPS) in Example 4.

DETAILED DESCRIPTION

Figure 1:
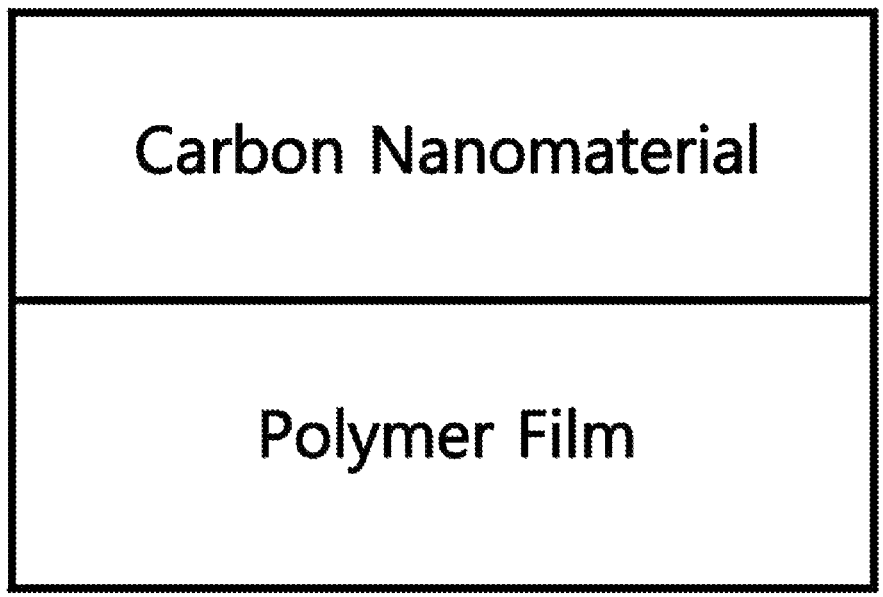
FIG. 1 shows a schematic view illustrating the sectional structure of each of the carbon nanomaterial/polymer film structures according to Examples 2 and 3.

Hereinafter, preferred embodiments of the present disclosure will be described in detail.

The exemplary embodiments disclosed herein are illustrative purposes only, and the present disclosure may be embodied in many different forms and should not be construed as limited to the exemplary embodiments set forth therein.

It should be understood that since various modifications may be made to this disclosure and this disclosure may be embodied in different forms, the description proposed herein is just a preferable example for the purpose of illustrations only, not intended to limit the scope of the disclosure, and other changes, equivalents and modifications within the scope of the disclosure will become apparent to those skilled in the art from this detailed description.

Carbon Nanomaterial-Based Structure

In one aspect of the present disclosure, there is provided a carbon nanomaterial-based structure, including: a polymer resin layer; and a carbon nanomaterial layer stacked on the polymer substrate, wherein the carbon nanomaterial is a doped carbon nanomaterial.

According to an embodiment of the present disclosure, the polymer substrate may have at least one chemical structure selected from the group consisting of methyl, ethyl, phenyl, allyl, benzyl, alkene, alkyne, arene, phenol, benzoyl, alkyl halide, alcohol, ether, aldehyde, ketone, carboxylic acid, ester, amide, amine, imine, thiol, sulfide, nitrile, peroxide, or the like. Particularly, the polymer substrate undergoes a change in chemical structure by the irradiation of electron beams, and such a change in chemical structure of the polymer substrate causes the carbon nanomaterial layer stacked on the polymer substrate layer to accept electrons or holes (lack of electrons) so that it may be doped.

According to an embodiment of the present disclosure, the polymer resin may be derived from at least one selected from the group consisting of polyimide (PI), colorless polyimide (cPI), polymethyl methacrylate (PMMA), polyethylene terephthalate (PET), polyethylene naphthalate (PEN), polydimethyl siloxane (PDMS), polyether sulfone (PES), polyetheretherketone (PEEK), polyvinyl chloride (PVC) and polycarbonate (PC). For example, the polymer resin may be modified by electron beams.

According to an embodiment of the present disclosure, the carbon nanomaterial may include at least one selected from the group consisting of carbon fibers, graphene, carbon nanotubes, graphite, carbon quantum dots, graphene nanoplates (GNPs), graphene oxide, amorphous carbon and carbon black. For example, the carbon nanomaterial may be graphene or carbon nanotubes.

According to an embodiment of the present disclosure, the doped carbon nanomaterial may have P- or N-type structure/characteristics by the electron-donating or -withdrawing from the polymer resin or substrate layer through a charge transfer mechanism. For example, graphene as a carbon nanomaterial is a bipolar material having both N-type and P-type characteristics, and may have an N-type structure when the electron concentration is increased, and a P-type structure when the electron concentration is decreased. Such a doping type does not affect the transmission, and there is no difference in sheet resistance depending on the doping type. If graphene is P-type doped, the sheet resistance is in inverse proportion to the carrier density, and thus the sheet resistance is reduced, as the hole concentration is increased. Thus, the more a dopant capable of increasing the concentration of holes, the more the doping effect.

Therefore, many studies have been conducted continuously about an excellent dopant and doping method, and the conventional doping methods for a carbon nanomaterial, such as graphene, mainly use adsorption of an additional dopant to the carbon nanomaterial. On the contrary, production of a carbon nanomaterial-based structure according to an embodiment of the present disclosure is carried out by doping a carbon nanomaterial through the irradiation of electron beams, which corresponds to a novel doping method requiring no additional dopant.

For example, in the case of electron-withdrawing, the intrinsic carrier concentration of graphene is increased from a scale of $10^{11}$ to $10^{13-15}$ $cm^{-2}$, the work function is decreased from 4 eV to 3-3.5 eV, and graphene shows N-type characteristics. Particularly, as mentioned above, graphene is a bipolar material and is sometimes neutral due to the nature of a bipolar material. This is referred to as a charge neutral point. The work function of graphene is 4.4 eV when the charge is neutral, P-type doped graphene shows a work function of higher than 4.4 eV, and a higher work function leads to a lower sheet resistance of graphene. In addition, N-type graphene shows a work function of lower than 4.4 eV, and a lower work function leads to a lower sheet resistance of graphene. In other words, in the case of electron-donating, the hole concentration is increased to $10^{13-15}$ $cm^{-2}$, the work function is increased to 5.3-5.9 eV, and graphene shows P-type characteristics.

According to an embodiment of the present disclosure, the carbon nanomaterial-based structure may have a sheet resistance ranging from 10 ohm/sq to 500 ohm/sq, particularly 100-200 ohm/sq. In addition, the carbon nanomaterial-based structure may have a sheet resistance uniformity with a sheet resistance non-uniformity of 20% or less, particularly 10% or less.

For example, the carbon nanomaterial-based structure may have a sheet resistance uniformity with a standard deviation of sheet resistance of 4-10 ohm/sq. Therefore, the carbon nanomaterial-based structure according to an embodiment of the present disclosure not only shows excellent sheet resistance characteristics but also have a uniform sheet resistance value throughout the overall structure.

According to an embodiment of the present disclosure, the carbon nanomaterial-based structure may have a transmission of 80% or more, particularly 90% or more. Therefore, the carbon nanomaterial-based structure may have a high transmission even after the electron beam irradiation, and may be applied to a transparent electrode with ease.

According to an embodiment of the present disclosure, the carbon nanomaterial-based structure may have a water permeability of $5 \times 10^{-1}$ $g/m^2$-day or less. Therefore, the carbon nanomaterial-based structure according to an embodiment of the present disclosure may have excellent water barrier property, and may be applied to a water and/or gas barrier including the carbon nanomaterial-based structure.

In another aspect of the present disclosure, there is provided a flexible transparent electrode including the carbon nanomaterial-based structure disclosed herein.

Method for Producing Carbon Nanomaterial-Based Structure

In still another aspect of the present disclosure, there is provided a method for producing a carbon nanomaterial-based structure, including the steps of: stacking a carbon nanomaterial layer on a polymer substrate layer; and irradiating electron beams to the carbon nanomaterial layer.

First, a carbon nanomaterial layer may be formed. Particularly, the carbon nanomaterial layer may be formed by supplying a reaction gas containing a carbon precursor and heat to a metal catalyst substrate and carrying out reaction. The stacked structure including the carbon nanomaterial formed as mentioned above may include the carbon nanomaterial and polymer film, stacked successively.

According to an embodiment of the present disclosure, the carbon nanomaterial layer may be formed by using a chemical vapor deposition (CVD) process, wherein it is preferred that the reaction gas containing a carbon precursor is supplied to the metal catalyst substrate, and heat treatment is carried out to allow growth of the carbon nanomaterial layer.

The metal applied to the metal catalyst substrate is not particularly limited. For example, the metal may be at least one metal selected from the group consisting of nickel, palladium, platinum, copper, titanium, ruthenium, chromium, iron, aluminum and silver, or an alloy thereof.

The metal catalyst substrate may have a thickness of 100 nm to 40 μm, the thickness relates to etching in a transferring process, and there may be a difference in surface states during a heat treatment process.

According to an embodiment, as chemical vapor deposition (CVD), at least one process selected from the group consisting of low-pressure chemical vapor deposition (LPCVD), ambient pressure chemical vapor deposition (APCVD), plasma-enhanced chemical vapor deposition (PECVD), inductively coupled plasma-chemical vapor deposition (ICP-CVD), rapid thermal chemical vapor deposition (RTCVD) and metal organic chemical vapor deposition (MOCVD) may be applied.

According to an embodiment, the carbon precursor used for the chemical vapor deposition (CVD) is not particularly limited. For example, the carbon precursor may be at least one precursor selected from the group consisting of carbon monoxide, carbon dioxide, methane, ethane, ethylene, ethanol, acetylene, propane, butane, butadiene, pentane, pentene, cyclepentadiene, hexane, cyclohexane, benzene and toluene.

In addition, the inert gas and mixed gas used for the chemical vapor deposition (CVD) may include at least one inert gas selected from the group consisting of argon, nitrogen, hydrogen, ammonia and helium, and at least one mixed gas selected from the group consisting of argon/hydrogen, argon/nitrogen, argon/ammonia and argon/helium mixed gases. Such inert gases and mixed gases affect the reaction rate during the formation of the carbon nanomaterial layer. When using hydrogen or nitrogen alone, it is possible to accelerate the reaction during the formation of the carbon nanomaterial film, but there is a problem in that reverse reaction may occur. Therefore, it is required to use such gases in an adequate amount.

Meanwhile, before forming the carbon nanomaterial layer, the metal catalyst substrate may be pretreated. Particularly, the metal catalyst substrate may undergo a pretreatment process including annealing, electrochemical polishing and surface cleaning.

In the annealing step, reaction is carried out for 30 minutes to 2 hours depending on the heat treatment time. In the cleaning step, the metal catalyst substrate may be treated by using at least one selected from the group consisting of a metal etchant, acetone, ethanol, methanol and isopropanol. Meanwhile, the pretreatment process may affect the removal of impurities on the metal catalyst substrate surface and the control of the metal catalyst surface roughness.

According to an embodiment, the carbon nanomaterial layer may be treated at a temperature ranging from 600 to 1100° C. for a processing time of 5 minutes to 1 hour, when being applied to a chemical vapor deposition process. The temperature and time applied during the production of the carbon nanomaterial film may affect the quality and growth range of the carbon nanomaterial. In addition, the reaction chamber is maintained preferably under a pressure of 100-760 mtorr.

Then, a polymer protective film may be formed in order to transfer the carbon nanomaterial film formed on the metal catalyst substrate. Both wet transfer and dry transfer may be used, and a dry transfer process may be favorable to a large-area process.

According to an embodiment, in order to transfer the carbon nanomaterial film formed on the metal catalyst substrate, the polymer protective film may include at least one polymer selected from the group consisting of polymethyl methacrylate, polydimethyl siloxane, polyvinyl alcohol, polyvinyl pyrrolidone and ethylene vinyl acetate. This is because such a polymer allows selective etching of the metal catalyst substrate used as a catalyst and transfer of the carbon nanomaterial film to a desired substrate.

The coating method used for forming the polymer protective layer on the carbon nanomaterial film may include spin coating, spray coating, drop coating, bar coating or dip coating.

Meanwhile, baking may be carried out to remove the organic solvent efficiently from the polymer protective film layer coated on the carbon nanomaterial film. Herein, baking may be carried out at a temperature of 50-150° C. for 5-30 minutes.

According to an embodiment, besides the method for forming a polymer protective film layer, a method for transferring the carbon nanomaterial formed on the metal catalyst substrate by using a thermal release tape or pressure sensitive tape as a carbon nanomaterial protective film layer may be applied for the purpose of transferring the carbon nanomaterial layer. The thermal release tape or pressure sensitive tape may be attached to the surface of the carbon nanomaterial through a roll-to-roll process, lamination process, or the like. In this manner, the method may be carried out in a continuous process.

Meanwhile, the carbon nanomaterial layer may be formed on both surfaces of the metal catalyst substrate. Thus, before removing the metal catalyst substrate, the carbon nanomaterial formed on the back surface of the carbon nanomaterial film may be removed through etching. The etching may be carried out by using an etching system, such as reaction ion etching (RIE), inductively coupled plasma RIE (ICP-RIE), electron cyclotron resonance RIE (ECR-RIE), reaction ion bean etching (RIBE) or chemical assistant ion beam etching (CAIBE).

According to an embodiment, the metal catalyst substrate may be removed by using an etching solution, such as ammonium persulfate, ferric chloride ($FeCl_3$), nitric acid, hydrochloric acid or sulfuric acid.

Then, the carbon nanomaterial layer may be stacked on the metal catalyst substrate. For example, a single carbon nanomaterial layer or multiple carbon nanomaterial layers may be transferred to and stacked on a polymer or a substrate including the same.

According to an embodiment, the polymer resin layer and the carbon nanomaterial layer may have a stacked structure in which they are in direct contact with each other, and may undergo electron-donating or electron-withdrawing through a charge transfer mechanism.

The substrate may include a transparent or flexible substrate. For example, the polymer resin may be at least one selected from the group consisting of polyimide (PI), colorless polyimide (cPI), polymethyl methacrylate (PMMA), polyethylene terephthalate (PET), polyethylene naphthalate (PEN), polydimethyl siloxane (PDMS), polyether sulfone (PES), polyetherether ketone (PEEK), polyvinyl chloride (PVC) and polycarbonate (PC).

After that, electron beams may be irradiated to the carbon nanomaterial/polymer composite layer. A voltage of 0-300 kV may be applied, and the irradiation dose may not be limited depending on the number of irradiation. However, an irradiation dose of 0-3000 kGy, preferably an irradiation dose of 200-1600 kGy may be suitable. The irradiated electron beams may transmit the carbon nanomaterial layer, and the transmitted electron beams cause a change in chemical structure of the polymer resin layer so that the carbon nanomaterial may be doped. For example, the carbon nanomaterial/polymer structure to which electron beams are irradiated at 1600 kGy may show resistance reduced by about 85% as compared to the same structure before electron beam irradiation, wherein the UV transmission may be decreased merely by 2.68%.

When producing the carbon nanomaterial-based structure according to an embodiment of the present disclosure, the carbon nanomaterial may be doped through electron beam irradiation. This corresponds to a novel doping method requiring no additional dopant, unlike the conventional methods for doping a carbon nanomaterial mainly based on adsorption of an additional dopant to the carbon nanomaterial.

According to an embodiment, in the electron beam irradiation step, cPI as an example of the polymer resin undergoes a change in chemical structure corresponding to a decrease in C=C bonds from 42.59% before irradiation to 0% after electron beam irradiation at 1600 kGy, and an increase in C—C bonds from 37.59% to 68.66%. In addition, double bonds, such as C=O and $CF_3$ bonding ratio are decreased, while the ratio of single bonds, such as C—OH, C—O—C, O—C=O and COOH/COOR is increased. The radicals, ions or electrons derived from such a change in chemical structure can increase the carrier concentration through the doping of the carbon nanomaterial. In other words, the radicals, ions or electrons with which the carbon nanomaterial is doped may function as dopants, and thus the carbon nanomaterial may be doped without any separate dopant.

Figure 2:
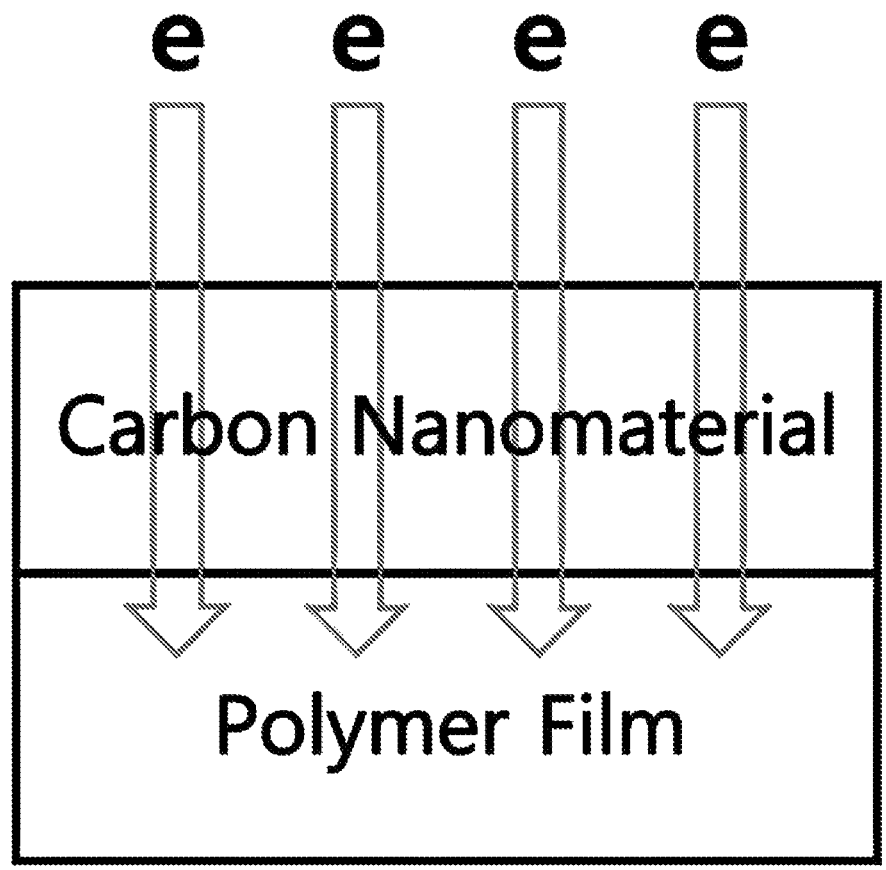
FIG. 2 shows a schematic view illustrating a step of irradiating electron beams to the carbon nanomaterial/polymer film structure according to Example 4.

According to an embodiment, electron beams are irradiated to the carbon nanomaterial layer, and the electron beams transmitted through the carbon nanomaterial layer may reach the polymer resin layer (see, FIG. 2).

According to an embodiment, electron beams may be irradiated to the carbon nanomaterial/polymer composite layer to cleave the double bond and/or single bond structure of the polymer layer. When the double bonds and single bonds are cleaved, radicals, ions and free electrons are generated, and all of the factors function as dopants of the carbon nanomaterial to cause an increase in carrier density and a decrease in sheet resistance. On the other hand, the transmission is reduced as trade-off, but the increment (20-85% of a decrement in sheet resistance) of conductivity is larger than the decrement (approximately 0.5-1%) of transmission. Therefore, it can be said that the method for doping a carbon nanomaterial by electron beam irradiation is a high-quality method.

Particularly, while the carbon-carbon double bonds and/or single bonds are cleaved, oxygen-containing single bonds are increased, and thus oxygen-containing functional groups, such as C—OH, C—O—C, O—C=O and COOH, are increased. As a result, the oxygen-containing functional groups allow P-type doping of the carbon nanomaterial. Therefore, when the single bonds are increased by the electron beam irradiation, it is possible to reduce the sheet resistance of the carbon nanomaterial.

Particularly, the carbon nanomaterial-based structure may show a decrease in visible light transmission of 10% or less, and for example, 3% or less, before and after irradiating the electron beams. In addition, the carbon nanomaterial-based structure may show a decrease in sheet resistance of 50% or more, and for example, 80% or more, before and after irradiating the electron beams. Thus, the increment of conductivity is significantly higher, as compared to the decrement of transmission.

Therefore, it is possible to obtain a carbon nanomaterial-based structure having both excellent sheet resistance characteristics and transmission characteristics at the same time through the method including an electron beam irradiation step according to an embodiment of the present disclosure.

According to an embodiment, the electron beam irradiation step may be carried out under inert gas atmosphere including at least one of argon, nitrogen and helium gases. Herein, any parameters other than electron beams may be eliminated by injecting an inert gas, such as argon or nitrogen, to reduce the oxygen concentration to 100 ppm or less.

According to an embodiment, in the electron beam irradiation step, dot-like or linear electron beams may be irradiated. Particularly, irradiation of linear electron beams may be applied efficiently to a continuous process, and in this case, electron beams may be irradiated to a large area.

According to an embodiment, in the electron beam irradiation step, electron beams may be irradiated at an absorption dose of 2000 kGy or less, preferably 200-1600 kGy. In a range of electron beam absorption dose from 200 kGy to 1600 kGy, the sheet resistance of the carbon nanomaterial may be reduced. Particularly, when the electron beam absorption dose is higher than 1600 kGy, stress may be applied to the carbon nanomaterial due to the heat generated during the electron beam irradiation, resulting in an increase in sheet resistance and a slight decrease in dopant ratio due to the crosslinking and re-grafting. The voltage applied herein may be varied in a range of 0-10 MeV, and the electron beam irradiation dose may be controlled depending on the applied voltage and current.

Therefore, the flexible transparent electrode including the carbon nanomaterial/polymer film composite structure obtained by the above-described method may be produced through a simple process, as compared to the other carbon nanomaterial-based flexible transparent electrodes, and may be highly suitable for linking to the conventional large-graphene synthesis/transfer process to be applied as a continuous process. In addition, it is possible to increase the conductivity of the carbon nanomaterial by virtue of an excellent doping effect. Further, the flexible transparent electrode is thermally stable, and thus can be used as an electrode material of various flexible transparent display devices.

Exemplary embodiments now will be described hereinafter so that the constitution and effect of the present disclosure may be explained in more detail. However, the following exemplary embodiments are for illustrative purposes only, and the scope of the present disclosure should not be construed as limited to the exemplary embodiments set forth therein.

Example 1: Production of Large-Area Graphene Film

A large-area graphene film was grown on a copper substrate by using a chemical vapor deposition (CVD) process. First, impurities were removed from the copper substrate surface and the roughness of the copper substrate surface was controlled through pretreatment, such as electrochemical polishing.

The size of graphene crystals on the polished copper substrate was increased through the two-step growing method, and defects of graphene was minimized by reducing the grain boundary. The polished copper substrate was introduced to a furnace and heated to 1030° C. at a pressure of 340 mtorr under the atmosphere of 100 sccm of hydrogen, and then heat treatment was carried out for 50 minutes under the same atmosphere. Then, a mixed gas of 5 sccm of methane and 100 sccm hydrogen was allowed to flow at a pressure of 365 mtorr for 1 minute, and then the content of methane was increased and a mixed gas of 13 sccm of methane and 100 sccm of hydrogen was allowed to flow at a pressure of 405 mtorr for 8 minutes. In addition, the copper substrate was cooled rapidly to room temperature at a pressure of 72 mtorr under the atmosphere of 15 sccm of hydrogen.

Example 2: Production of Graphene/Polymer Film Composite (Graphene/cPI)—Wet Transfer Ethylene vinyl acetate (EVA) was spin coated on the graphene prepared according to Example 1 at 4000 rpm for 60 seconds, and the EVA-coated graphene film was baked at 100° C. for 30 minutes.

Then, oxygen plasma reactive ion etching was carried out to remove graphene on the back surface of the copper substrate. After that, the resultant structure was allowed to float on 0.1 M ammonium persulfate solution for 2 hours to remove the copper substrate. The ammonium persulfate solution remaining on the graphene film was removed by using tertiary distilled water, and the graphene film was transferred to a cPI substrate. The cPI substrate was the product of PIF-TP-50SP available from ISOFLEX. The cPI substrate to which graphene was transferred was dried at room temperature and baked at 80° C. for 1 hour. Then, the resultant structure was dipped in toluene for 1 hour to remove EVA on the graphene, toluene was removed by using alcohol, and baking was carried out at 50° C. for 30 minutes to obtain a graphene/cPI film composite (FIG. 1).

Example 3: Production of Large-Area Graphene/Polymer Film Composite (Graphene/cPI)—Dry Transfer A graphene film manufactured in a large-area chemical vapor deposition system was cut into a A4 paper size (297×210 mm), and a thermal release tape was attached to the graphene/copper structure by using a lamination device.

Under the same condition as Example 2, graphene on the back surface of the copper substrate was removed through oxygen plasma reactive ion etching, the copper substrate was removed by using ammonium persulfate, and graphene was washed with tertiary distilled water.

Then, nitrogen was blown to the thermal release tape/graphene structure to remove water remaining on the graphene surface, and the resultant structure was attached to a large-area cPI substrate at 100° C. through a hot lamination process. During the hot lamination process, the thermal release tape losing its adhesion was detached from graphene, and thus a graphene/cPI structure remained. After that, baking was carried out at 100° C. for 1 hour to increase the binding force between graphene and cPI.

Example 4: Doping of Graphene/Polymer Film Composite (Graphene/cPI) Through Electron Beam Irradiation The graphene/cPI composite obtained from Example 2 or 3 was loaded on an electron beam irradiation device, and electron beams were irradiated at different irradiation doses ranging from 200 kGy to 1600 kGy to determine the doping efficiency depending on irradiation dose (FIG. 2).

Figure 3:
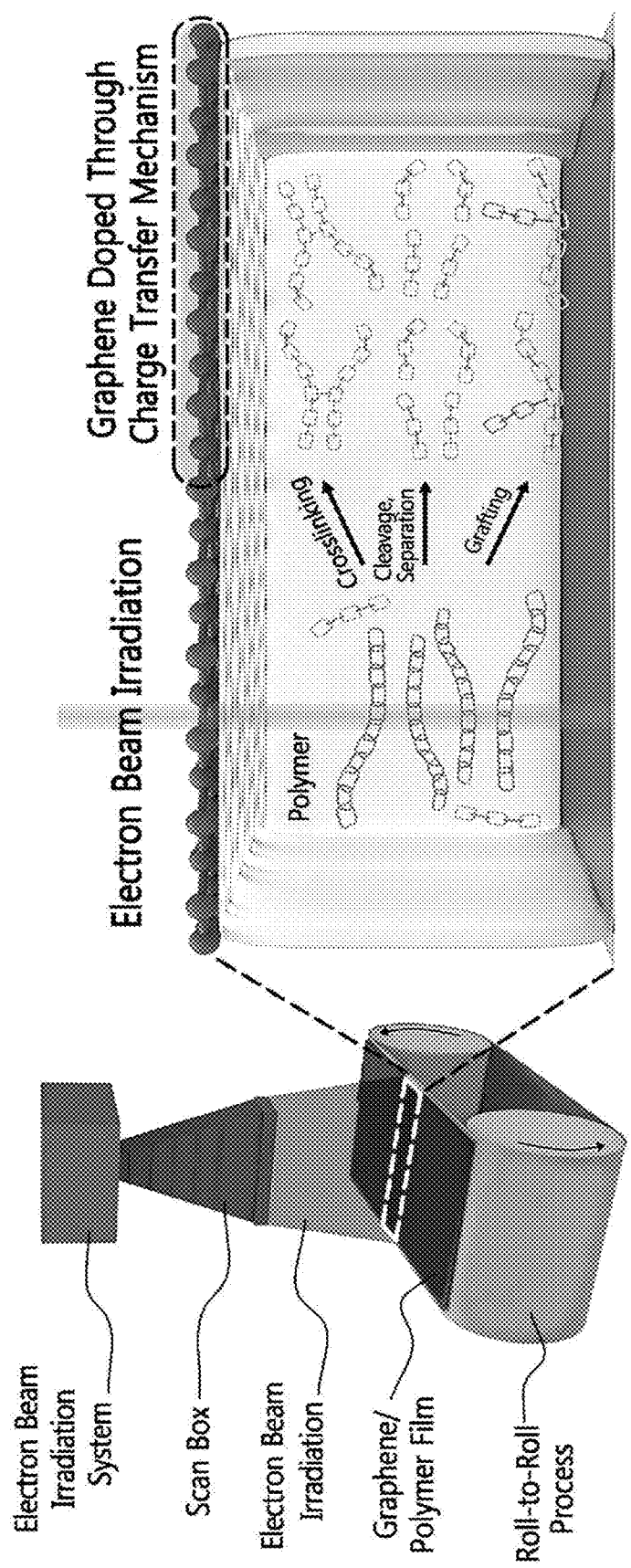
FIG. 3 shows a schematic view illustrating a step of irradiating electron beams to the carbon nanomaterial/polymer film structure according to Example 4, and schematically illustrates that the chemical structure of the polymer film is changed by the electron beams, and the carbon nanomaterial is doped.

Upon the electron beam irradiation, the same was transferred at a rate of 3 m/min, a process of irradiating linear electron beams and transferring the sample was carried out, and cleavage and separation, crosslinking and grafting of the polymer chains forming cPI occurred during the process (FIG. 3). Upon the electron beam irradiation, oxygen concentration was as low as 100 ppm under nitrogen atmosphere, and a significantly short processing time of less than 1 minute was required.

Figure 4:
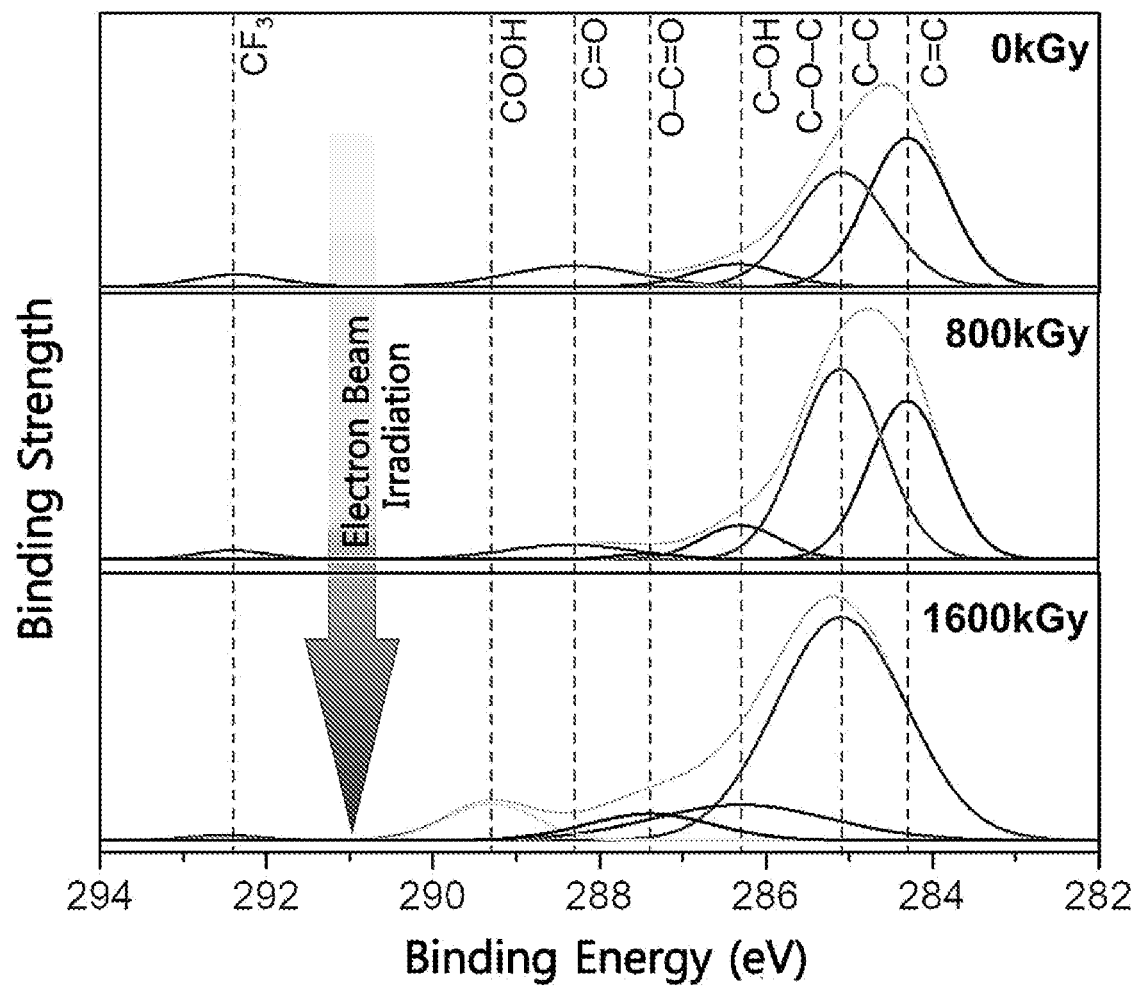
FIG. 4 shows the result of X-ray photoelectron spectroscopy (XPS) of a change in chemical structure of graphene/cPI before and after irradiating electron beams in Example 4.

Test Example: Analysis of Physical Properties of Graphene-Based Flexible Transparent Electrode FIG. 4 shows the result of X-ray photoelectron spectroscopy (XPS) of a change in chemical structure of graphene/cPI before and after irradiating electron beams in Example 4.

FIG. 5 is a table illustrating the ratio of chemical bonding to C1s of graphene/cPI before and after irradiating electron beams, as analyzed by X-ray photoelectron spectroscopy (XPS) in Example 4. In the case of C=C bonds, the ratio was decreased from 42.59% before irradiation to 0% after irradiating electron beams at 1600 kGy. In addition, the ratio of C—C bonds was increased from 37.59% to 68.66%. Further, the ratio of double bonds, such as C=O, and $CF_3$ was decreased, while the ratio of single bonds, such as C—OH, C—O—C, O—C=O and COOH/COOR, was increased. The radicals, ions or electrons derived from such a change in chemical structure were doped to graphene, thereby providing an increased carrier concentration.

Figure 6:
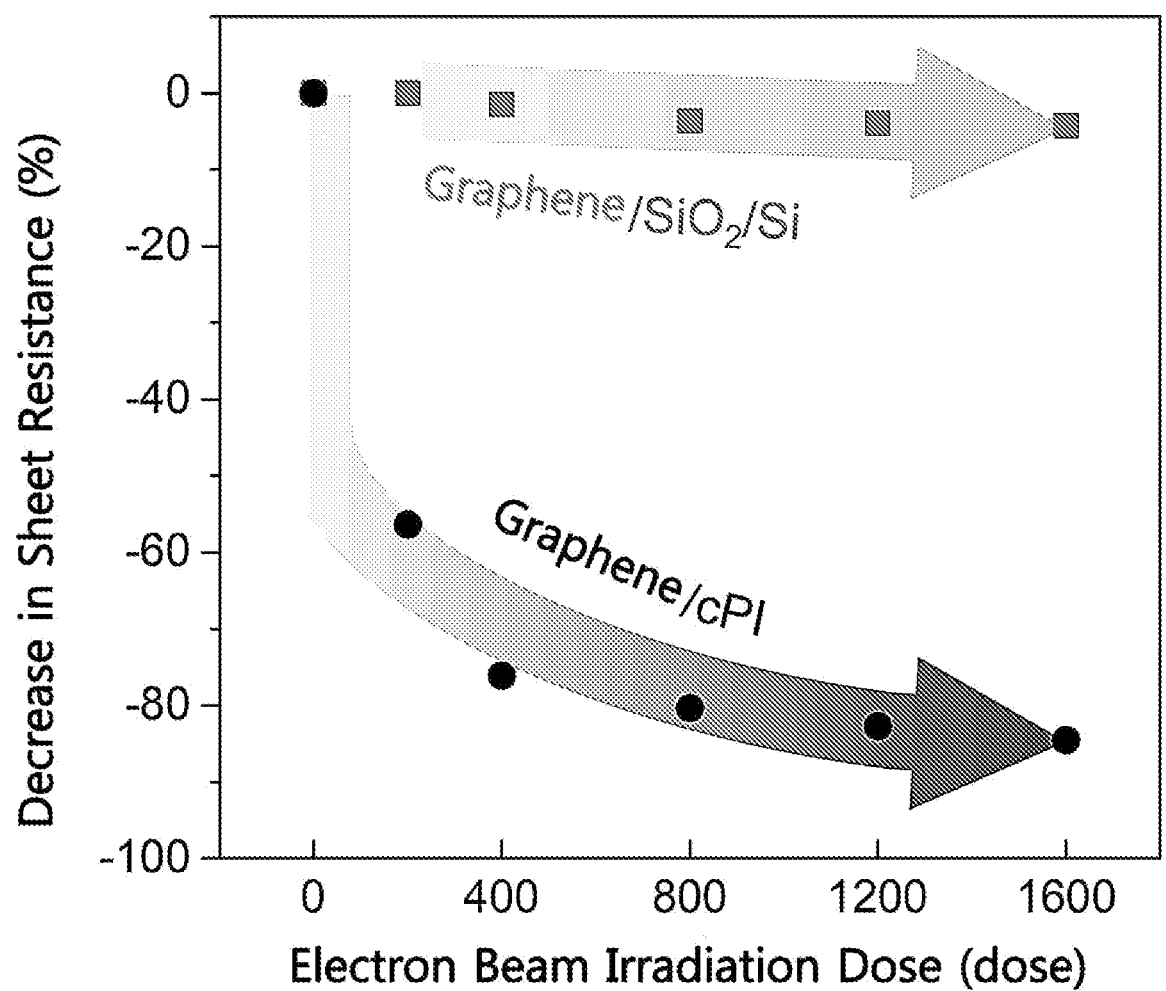
FIG. 6 shows the result of determination of sheet resistance using the four-point probe measurement, before and after irradiating electron beams, in order to illustrate the applicability of graphene/cPI as a flexible transparent electrode after irradiating electron beams (200-1600 kGy) in Example 4, and also shows the sheet resistance result of graphene/SiO$_2$/Si as control before and after irradiating electron beams, wherein the sheet resistance of the graphene/cPI substrate is significantly reduced by the electron beams.
Figure 7:
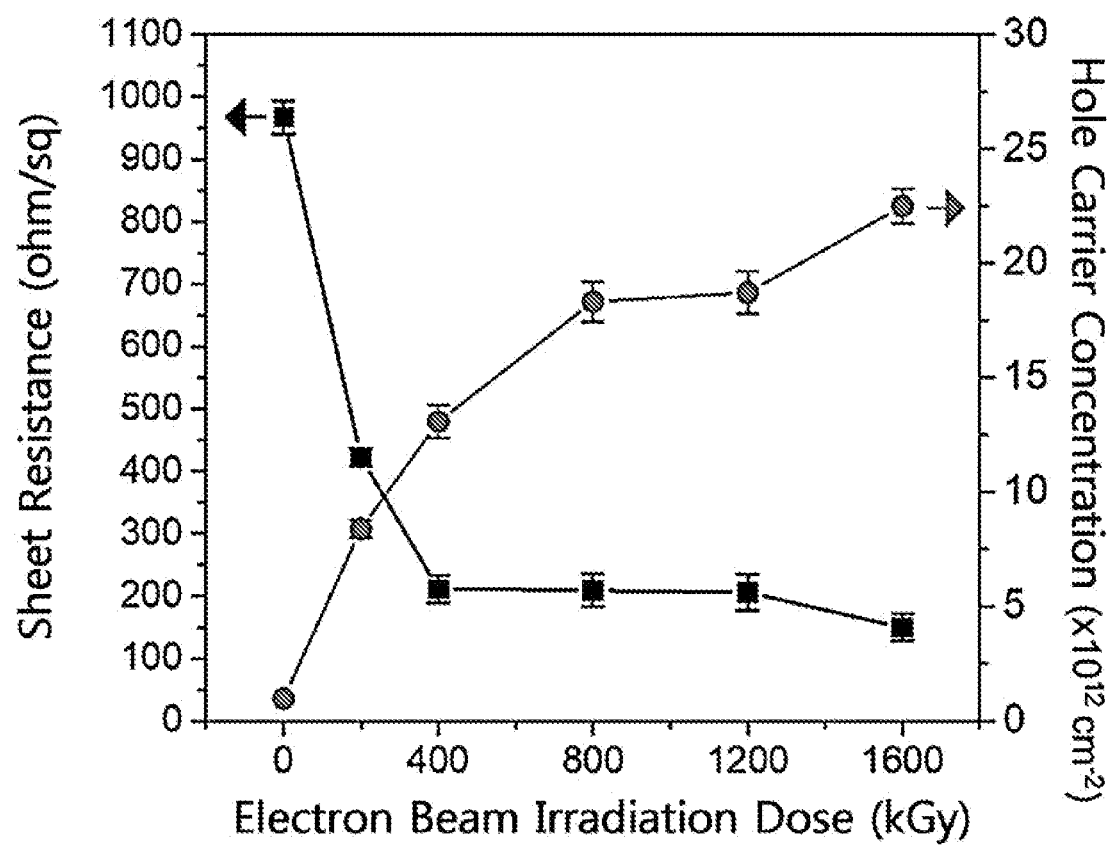
FIG. 7 shows the result of a change in sheet resistance and carrier concentration of graphene/cPI depending on electron beam irradiation dose (200-2800 kGy) in Example 4, as determined by each of the four-point probe measurement and van der Pauw measurement.

FIG. 6 shows the result of determination of sheet resistance using the four-point probe measurement, before and after irradiating electron beams, in order to illustrate the applicability of graphene/cPI as a flexible transparent electrode after irradiating electron beams (200-1600 kGy) in Example 4, and also shows the sheet resistance result of graphene/$SiO_2$/Si as control before and after irradiating electron beams, wherein the sheet resistance of the graphene/cPI substrate is significantly reduced by the electron beams. It can be seen that a change in chemical structure of the polymer resin layer occurs by the electron beams, and particularly, a large amount of water-containing chemicals, such as C—OH and COOH, is generated. Since —OH group is a P-type dopant for graphene, it can be stated that graphene is doped with the polymer resin modified with electron beams. FIG. 7 shows the result of a change in sheet resistance and carrier concentration of graphene/cPI depending on electron beam irradiation dose (200~2800 kGy) in Example 4, as determined by each of the four-point probe measurement and van der Pauw measurement.

Figure 8:
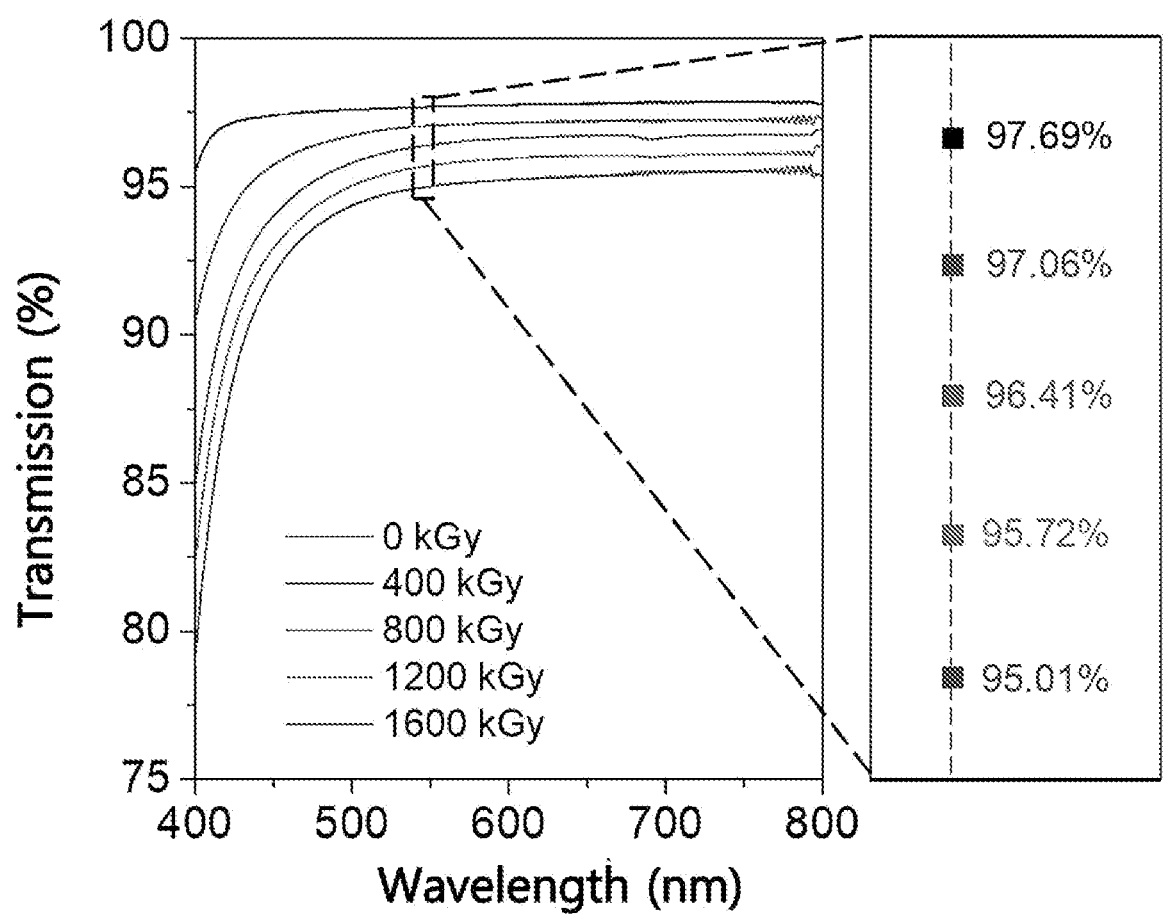
FIG. 8 shows the result of transmission of graphene/cPI according to Example 4 in the visible light wavelength region, as determined by UV-Vis spectrometer, the result suggesting the applicability as a flexible transparent electrode.

FIG. 8 shows the result of transmission of graphene/cPI according to Example 4 in the visible light wavelength region, as determined by UV-Vis spectrometer, the result suggesting the applicability as a flexible transparent electrode. Meanwhile, as the electron beam irradiation dose is increased, the transmission is decreased partially, but it can be seen that the decrement is insignificant at about 0.005%/kGy. It can be also seen that graphene shows a high transmission of 95% in the case of irradiation at 1600 kGy with the lowest sheet resistance. In general, the reference value of transmission in use as a transparent electrode is 90% or more, and thus the graphene/polymer film composite according to an embodiment of the present disclosure is suitable for use as a transparent electrode.

Figure 9:
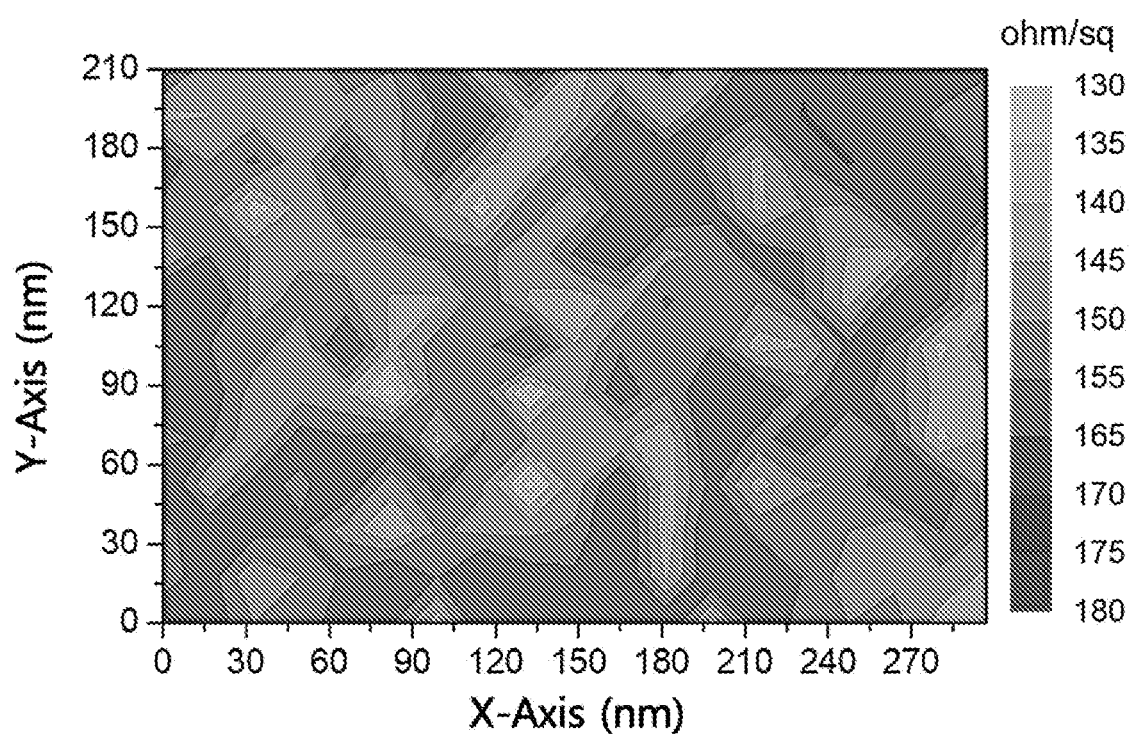
FIG. 9 shows the results of sheet resistance of the large-area graphene/cPI according to each of Examples 3 and 4, after irradiating electron beams at 1600 kGy.

FIG. 9 shows the results of sheet resistance of the large-area graphene/cPI (210×297 mm$^2$) according to each of Examples 3 and 4, after irradiating electron beams at 1600 kGy. It can be seen from the results that the method of electron beam irradiation according to the present disclosure allows uniform doping, as compared to the conventional doping methods using a dopant.

Figure 10:
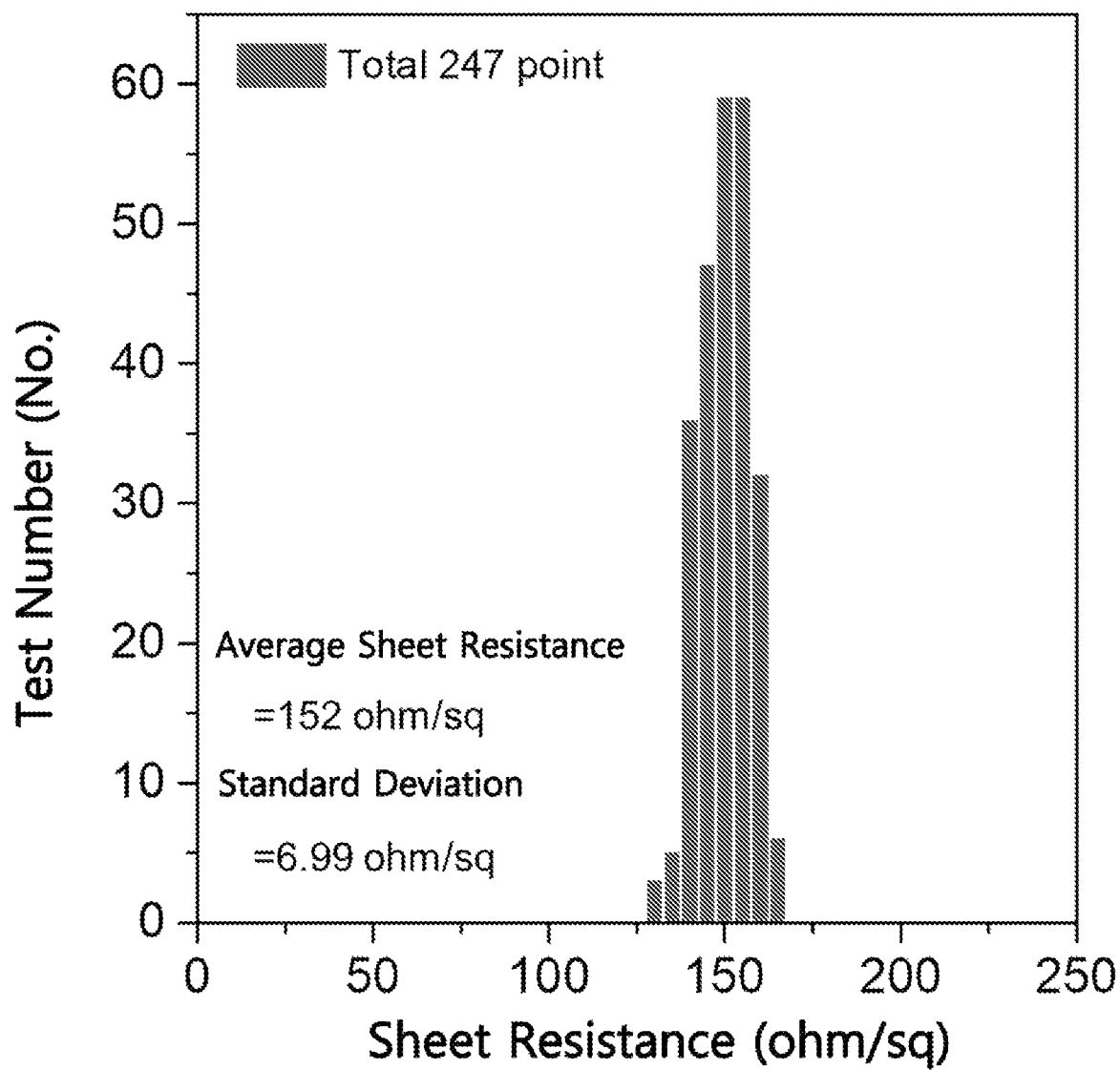
FIG. 10 is a dispersion diagram illustrating the result of sheet resistance of the large-area graphene/cPI according to each of Examples 3 and 4, after irradiating electron beams at 1600 kGy.

FIG. 10 is a dispersion diagram illustrating the result of sheet resistance of the large-area graphene/cPI (210×297 mm$^2$) according to each of Examples 3 and 4, after irradiating electron beams at 1600 kGy. The average sheet resistance and standard deviation are 152 ohm/sq and 6.99 ohm/sq, respectively. Since the standard deviation is significantly low, it can be seen that the large-area graphene is doped significantly uniformly by the electron beams.

Figure 11:
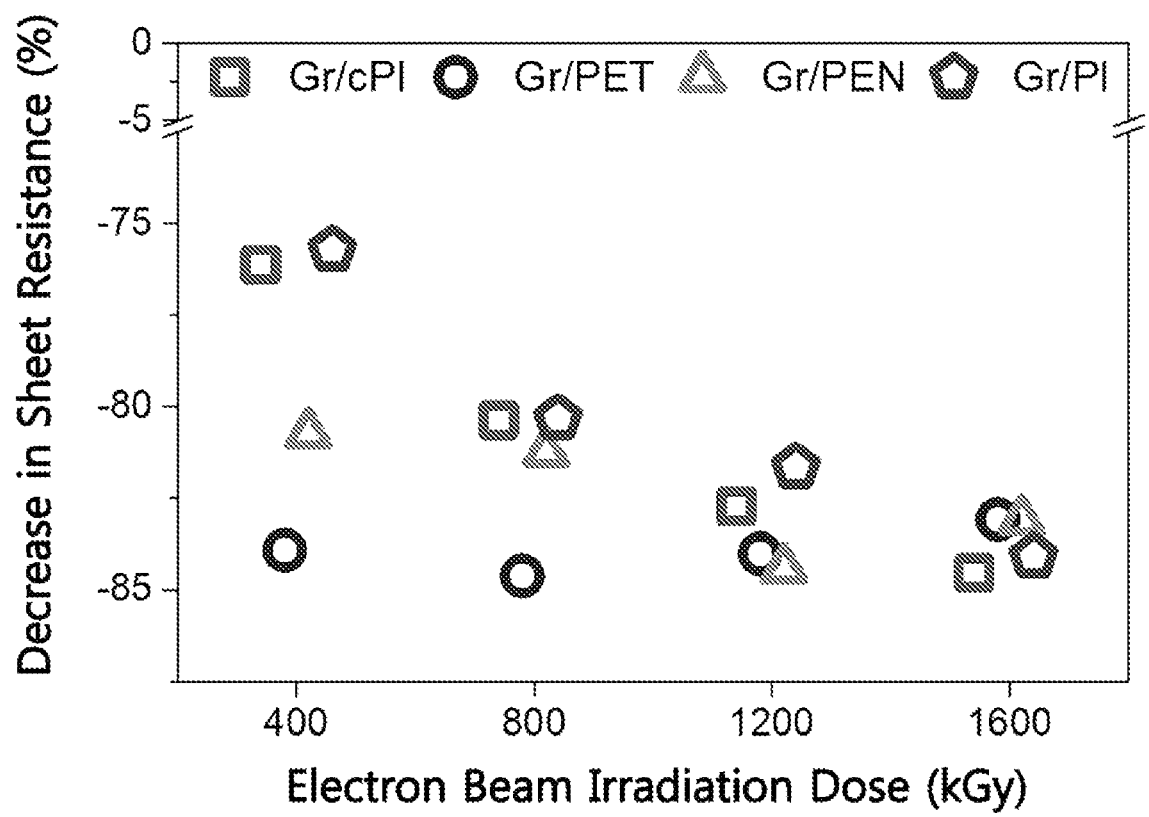
FIG. 11 illustrates a decrease in sheet resistance of graphene transferred to various polymer resin substrates according to Example 4, after irradiating electron beams.

FIG. 11 illustrates a decrease in sheet resistance of graphene transferred to various polymer resin substrates according to Example 4, after irradiating electron beams. It can be seen that the sheet resistance is reduced after electron beam irradiation in all cases using various polymer resins, such as cPI, PET, PEN and PI.

Figure 12:
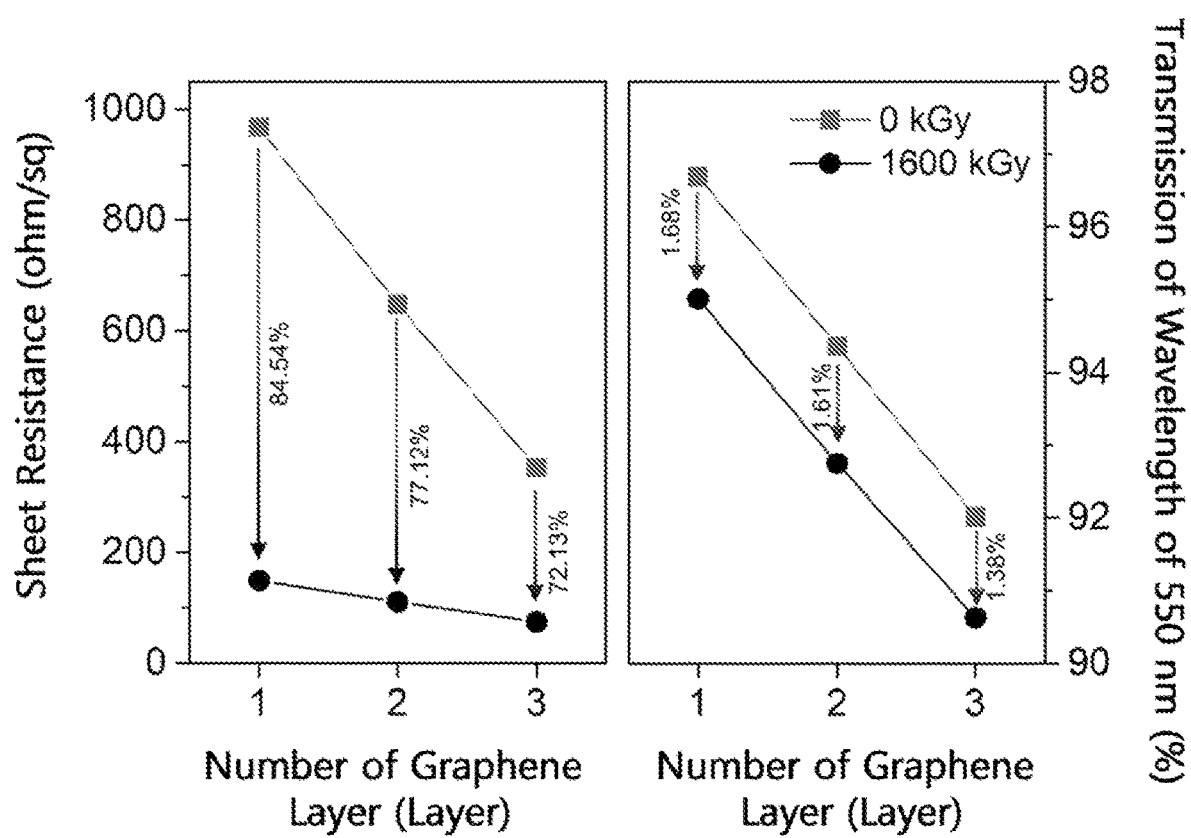
FIG. 12 shows the results of sheet resistance and transmission of light with a wavelength of 550 nm, after transferring graphene repeatedly to cPI according to Example 4 to form a bilayer or trilayer structure and irradiating electron beams thereto at 1600 kGy.

FIG. 12 shows the results of sheet resistance and transmission of light with a wavelength of 550 nm, after transferring graphene repeatedly to cPI according to Example 4 to form a bilayer or trilayer structure and irradiating electron beams thereto at 1600 kGy. As the number of layers is increased, the bilayer graphene shows a sheet resistance of 100.76 ohm/sq, a decrease in sheet resistance of 77.12% and a decrease in transmission of 74.98 ohm/sq. The sheet resistance of trilayer graphene is 74.98 ohm/sq (<100 ohm/sq) with a decrease in sheet resistance of 72.13%, and the trilayer graphene shows a visible light transmission of 90.63% higher than 90%. Such results are better than the reference values (a sheet resistance of 100 ohm/sq or less and a transmission of 90% or more) of a transparent electrode. Therefore, it can be seen that electron beams transmit multilayer stacked graphene to modify the chemical structure of the substrate, and thus even the multilayer graphene can be doped.

Figure 13:
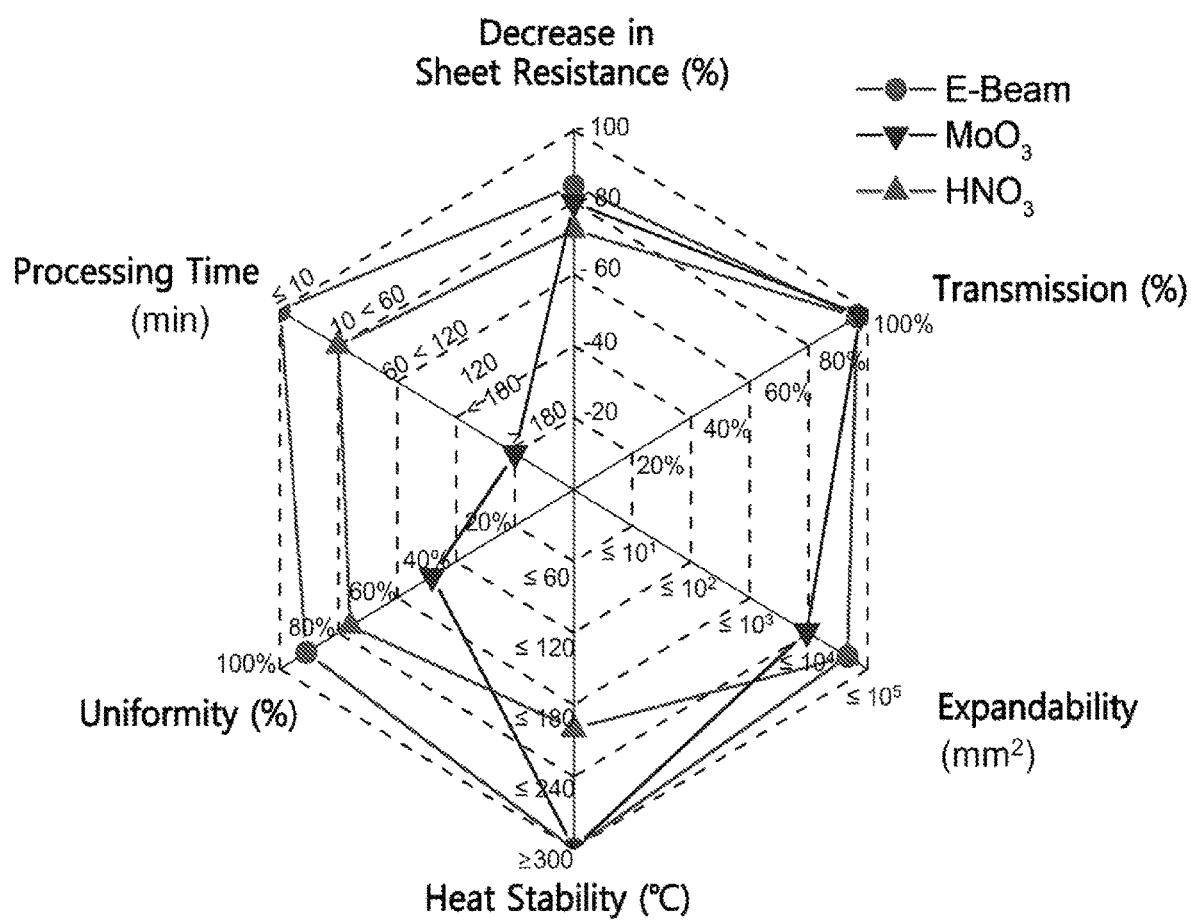
FIG. 13 shows summarized data of various characteristics of the doping method using electron beam irradiation, as compared to the other doping methods ($HNO_3$ coating, $MoO_3$ deposition) for reducing the sheet resistance of a carbon nanomaterial.

FIG. 13 shows summarized data of various characteristics of the doping method using electron beam irradiation, as compared to the other doping methods (HNO$_3$ coating, MoO$_3$ deposition) for reducing the sheet resistance of a carbon nanomaterial. All samples are prepared with a size of 100×100 mm$^2$.

HNO$_3$ was diluted with deionized water (DI) to 65%. The mixture was agitated so that the two ingredients might be mixed well. Next, 65% HNO$_3$ was received in a circular container, and graphene/cPI was dipped therein. Then, the container was positioned on a hot plate to increase the temperature to 52° C. When the temperature reached 52° C., the graphene/cPI was removed after the lapse of 15 seconds. Then, baking was carried out at 100° C. for 10 minutes on the hot plate to increase the adsorption force between HNO$_3$ and graphene/cPI.

MoO$_3$ was deposited on graphene/cPI through a thermal deposition process. MoO$_3$ powder was received in a tungsten boat of a thermal deposition device in an amount of about 5-10 g. After graphene/cPI was attached to a deposition holder, the thermal deposition device was allowed to be in a high vacuum (~10$^{-8}$ torr) state by using a rotary and turbo pump. Then, electric current and voltage were applied to generate Joule heat in the tungsten boat. In this manner, MoO$_3$ vaporized by heat was deposited on graphene to a thickness of 20 nm. After waiting until the temperature reached room temperature, nitrogen or argon was introduced to the deposition device to form an environment of ambient pressure. The resultant product was baked on a hot plate for 30 minutes to increase the binding force between MoO$_3$ and graphene.

Figure 14:
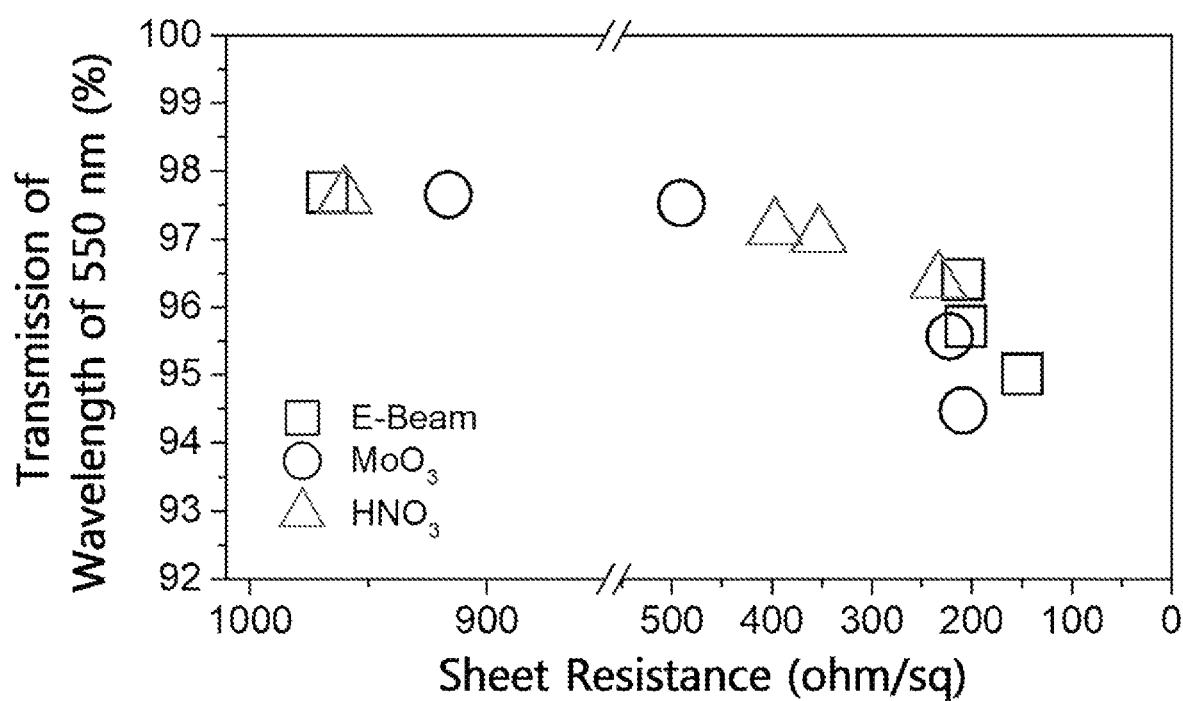
FIG. 14 illustrates the results of transmission Vs. sheet resistance of various doping methods including electron beam irradiation.

FIG. 14 illustrates the results of transmission Vs. sheet resistance of various doping methods including electron beam irradiation. It can be seen from the results that the electron beam irradiation method according to an embodiment of the present disclosure provides excellent transmission and sheet resistance characteristics, as compared to the other doping methods (HNO$_3$ coating, MoO$_3$ deposition).

Figure 15:
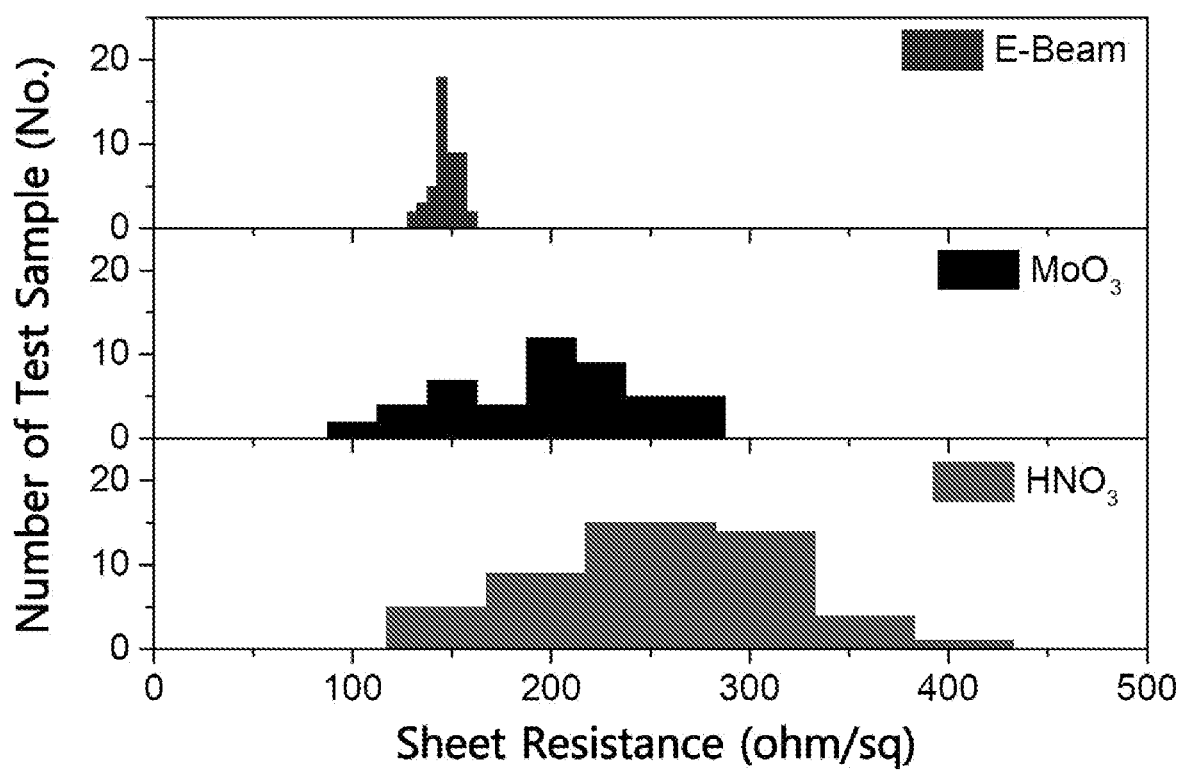
FIG. 15 illustrates the results of sheet resistance uniformity of various doping methods including electron beam irradiation.

FIG. 15 illustrates the results of sheet resistance uniformity of various doping methods including electron beam irradiation. It can be seen from the results that the electron beam irradiation method according to an embodiment of the present disclosure provides excellent sheet resistance uniformity characteristics, as compared to the other doping methods (HNO$_3$ coating, MoO$_3$ deposition).

Figure 16:
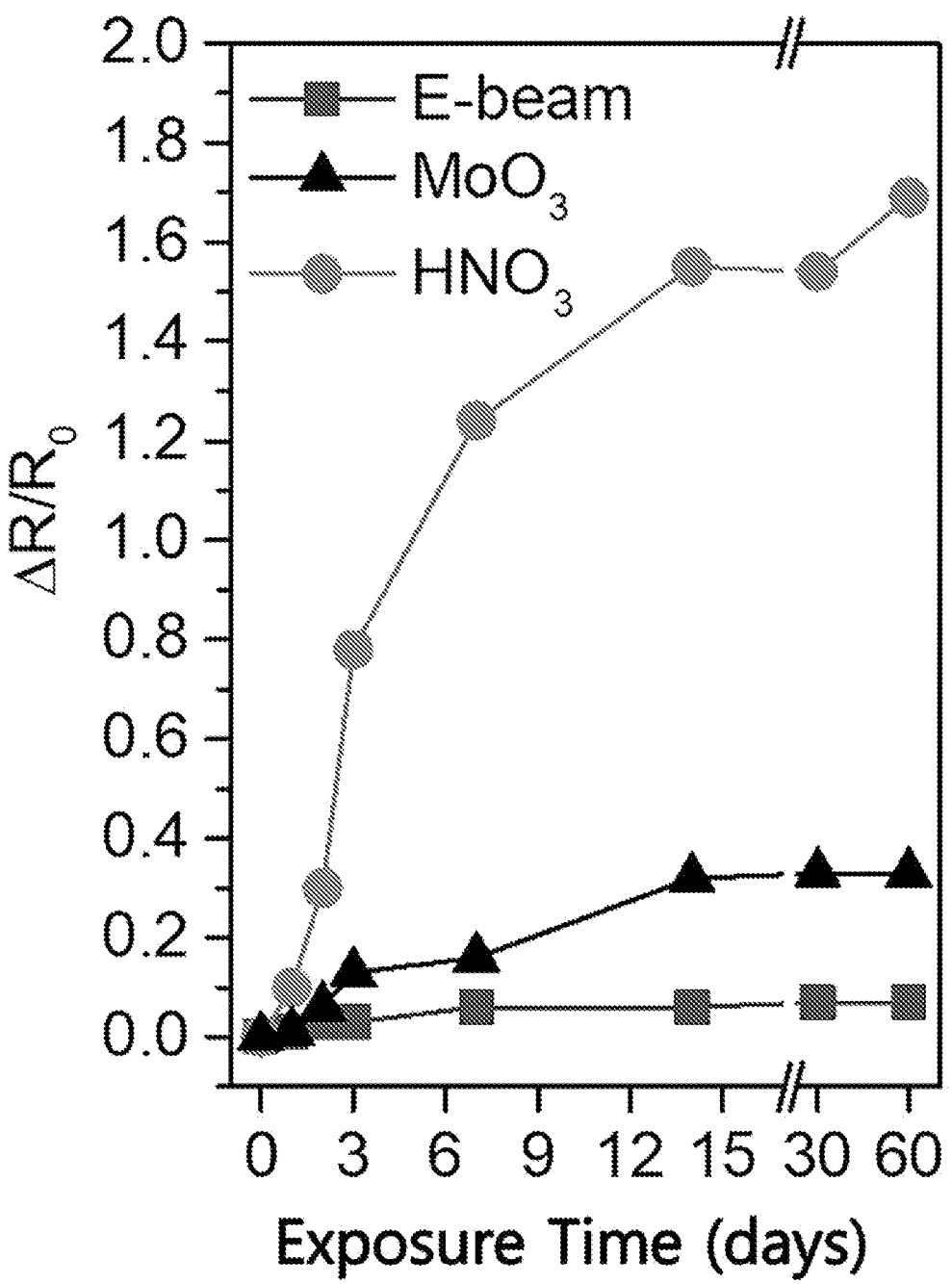
FIG. 16 illustrates the air exposure stability comparison values of various doping methods including electron beam irradiation.

FIG. 16 illustrates the air exposure stability comparison values of various doping methods including electron beam irradiation. It can be seen from the results that the electron beam irradiation method according to an embodiment of the present disclosure shows excellent stability (sheet resistance is increased by 7% after 60 days), as compared to the other doping methods (sheet resistance is increased by 169% after 60 days in the case of HNO$_3$ coating, and sheet resistance is increased by 7% after 60 days in the case of MoO$_3$ deposition).

Figure 17:
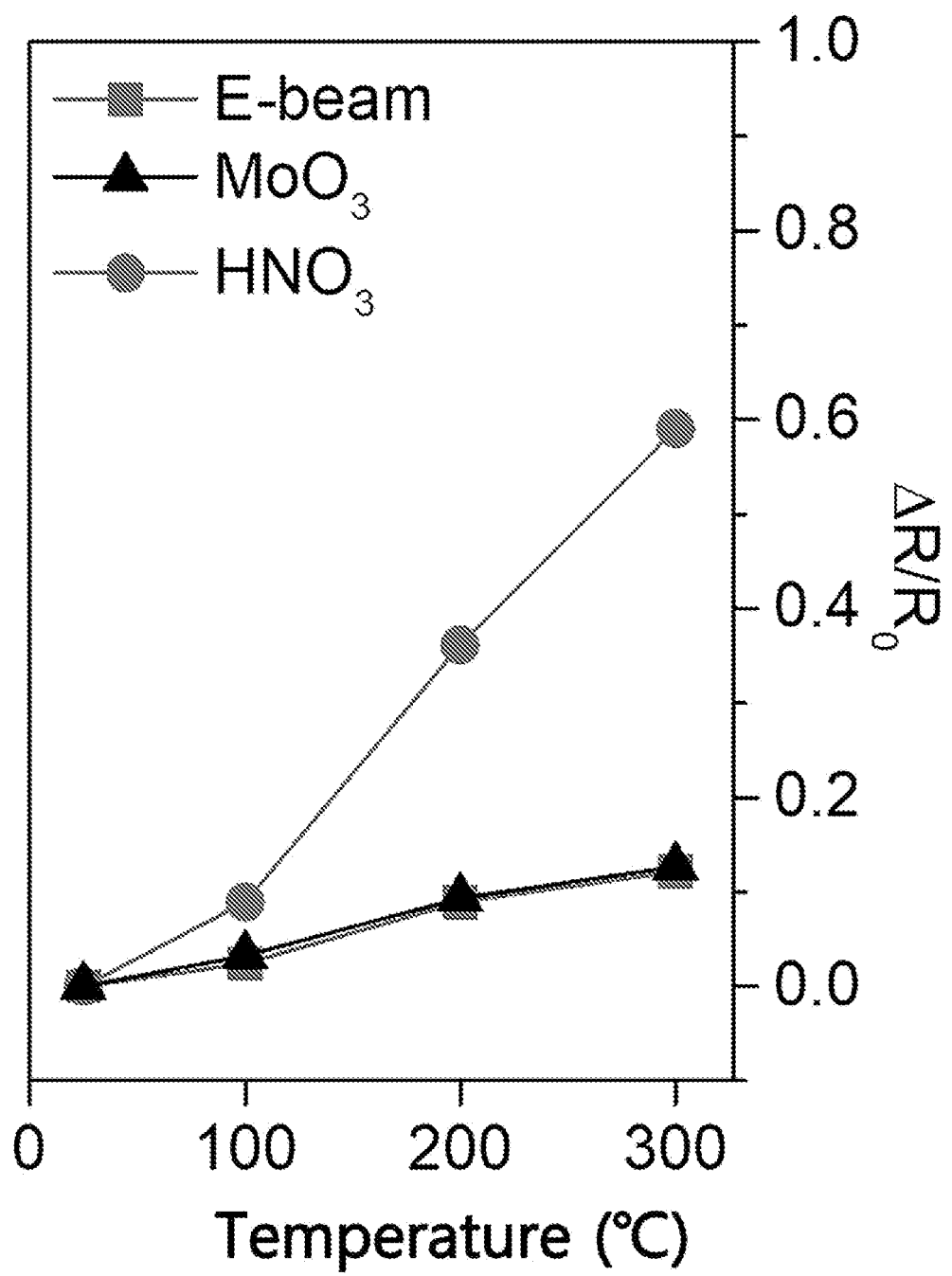
FIG. 17 illustrates the heat stability comparison values of various doping methods including electron beam irradiation.

FIG. 17 illustrates the heat stability comparison values of various doping methods including electron beam irradiation. It can be seen from the results that the electron beam irradiation method according to an embodiment of the present disclosure shows excellent stability (sheet resistance is increased by 12% at 300° C.), as compared to the other doping methods (sheet resistance is increased by 59% at 300° C. in the case of HNO$_3$ coating, and sheet resistance is increased by 12.7% at 300° C. in the case of MoO$_3$ deposition).

It should be understood that the above-described embodiments are given by way of illustration only and the scope of the present invention is not limited to the above detailed description. In addition, the scope of the present disclosure is defined by the following claims, and various changes, modifications and substitutions within the scope of the present disclosure will become apparent to those skilled in the art. Therefore, it is apparent to those skilled in the art that such modifications and changes fall within the scope of the present disclosure.

What is claimed is:

1. A carbon nanomaterial-based structure, comprising: a polymer resin layer; and a carbon nanomaterial layer stacked on the polymer resin layer,
wherein the carbon nanomaterial is a carbon nanomaterial doped with radical, ion, or electron derived from a change in chemical structure of the polymer resin by electron beams, and
wherein the doped carbon nanomaterial has P-type or N-type structure/characteristics by the electron-donating or electron-withdrawing from the polymer resin through a charge transfer mechanism.

2. The carbon nanomaterial-based structure according to claim 1, wherein the polymer resin has at least one chemical structure selected from the group consisting of methyl, ethyl, phenyl, allyl, benzyl, alkene, alkyne, arene, phenol, benzoyl, alkyl halide, alcohol, ether, aldehyde, ketone, carboxylic acid, ester, amide, amine, imine, thiol, sulfide, nitrile, and peroxide.

3. The carbon nanomaterial-based structure according to claim 1, wherein the polymer resin is derived from at least one selected from the group consisting of polyimide (PI), colorless polyimide (cPI), polyethylene terephthalate (PET), polyethylene naphthalate (PEN), polydimethyl siloxane (PDMS), polyether sulfone (PES), polyetheretherketone (PEEK), polymethyl methacrylate (PMMA), polyvinyl chloride (PVC) and polycarbonate (PC).

4. The carbon nanomaterial-based structure according to claim 1, wherein the carbon nanomaterial comprises at least one selected from the group consisting of carbon fibers, graphene, carbon nanotubes, graphite, carbon quantum dots, graphene nanoplates (GNPs), graphene oxide, amorphous carbon and carbon black.

5. The carbon nanomaterial-based structure according to claim 1, which has a sheet resistance ranging from 10 ohm/sq to 500 ohm/sq.

6. The carbon nanomaterial-based structure according to claim 1, which has a sheet resistance uniformity with a sheet resistance non-uniformity of 20% or less.

7. The carbon nanomaterial-based structure according to claim 1, which has a visible light transmission of 80% or more.

8. The carbon nanomaterial-based structure according to claim 1, which has a water permeability of $5 \times 10^{-1}$ g/m²-day or less.

9. A flexible transparent electrode comprising the carbon nanomaterial-based structure as defined in claim 1.

10. The carbon nanomaterial-based structure according to claim 1, wherein the polymer resin layer and the carbon nanomaterial layer are in direct contact with each other.

* * * * *